United States Patent
Senoo et al.

(10) Patent No.: US 9,847,504 B2
(45) Date of Patent: Dec. 19, 2017

(54) ELECTROLUMINESCENT DEVICE

(71) Applicant: Sharp Kabushiki Kaisha, Osaka-shi, Osaka (JP)

(72) Inventors: Tohru Senoo, Osaka (JP); Takeshi Hirase, Osaka (JP); Tetsuya Okamoto, Osaka (JP); Tohru Sonoda, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 15/028,067

(22) PCT Filed: Jul. 31, 2014

(86) PCT No.: PCT/JP2014/070257
§ 371 (c)(1),
(2) Date: Apr. 8, 2016

(87) PCT Pub. No.: WO2015/064162
PCT Pub. Date: May 7, 2015

(65) Prior Publication Data
US 2016/0240809 A1     Aug. 18, 2016

(30) Foreign Application Priority Data
Nov. 1, 2013  (JP) ................................. 2013-228309

(51) Int. Cl.
*H01L 51/52* (2006.01)
*H01L 27/32* (2006.01)

(52) U.S. Cl.
CPC ........ *H01L 51/524* (2013.01); *H01L 51/5259* (2013.01); *H01L 27/3244* (2013.01)

(58) Field of Classification Search
CPC ............... H01L 51/524; H01L 51/5259; H01L 27/3244
USPC ............................................................ 257/40
See application file for complete search history.

(56) References Cited

U.S. PATENT DOCUMENTS

2002/0060654 A1* 5/2002 Park ................... H01L 51/5259
                                                                 345/76
2008/0185960 A1* 8/2008 Koshiyama .......... H01L 51/524
                                                                 313/512

FOREIGN PATENT DOCUMENTS

| JP | 2002-216952 A   | 8/2002 |
|----|-----------------|--------|
| JP | 2005-174557 A   | 6/2005 |
| JP | 2006-228532 A   | 8/2006 |
| JP | 2006228532 A  * | 8/2006 |

OTHER PUBLICATIONS

Official Communication issued in International Patent Application No. PCT/JP2014/070257, dated Oct. 7, 2014.

* cited by examiner

*Primary Examiner* — Fernando L Toledo
*Assistant Examiner* — Adam S Bowen
(74) *Attorney, Agent, or Firm* — Keating & Bennett, LLP

(57) ABSTRACT

An organic EL display device (electroluminescent device) equipped with an organic EL element (electroluminescent element) includes an opposing substrate that is provided on an organic EL element side and that opposes a TFT substrate (substrate), a desiccant that is provided between the TFT substrate and the opposing substrate in such a manner as to cover the organic EL element, a frame-shaped seal material that seals the organic EL element between the TFT substrate and the opposing substrate, and a holding member for holding the desiccant, the holding member being provided on the opposing substrate side inside the seal material.

7 Claims, 15 Drawing Sheets

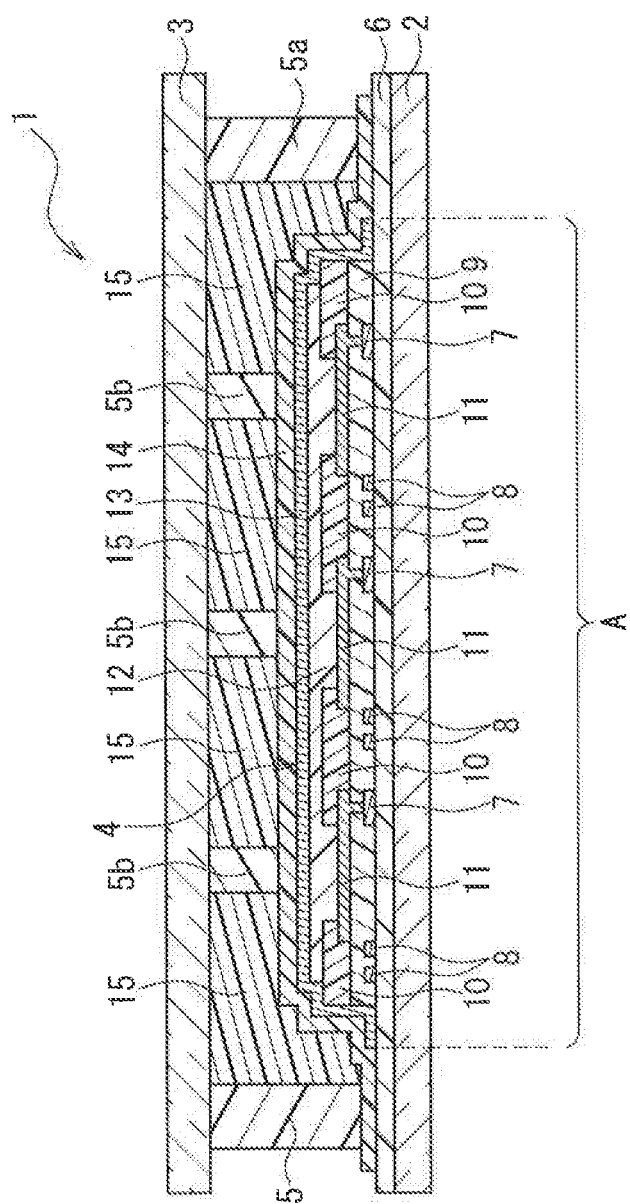
F I G. 12

ELECTROLUMINESCENT DEVICE

TECHNICAL FIELD

The present invention relates to an electroluminescent device having an EL (electroluminescent) element.

BACKGROUND ART

In these years, flat panel displays are used in a variety of commercial products and fields, and it is required to further increase the size, improve the image quality, and reduce the power consumption of flat panel displays.

In these circumstances, organic EL display devices equipped with organic EL (electroluminescent) elements that use electroluminescence (Electro Luminescence) of organic materials are recognized as all-solid-state flat panel displays that are excellent in terms of their low-voltage driving capability, fast responsiveness, self-luminous property, and the like, and are attracting considerable attention.

For example, in an active-matrix organic EL display device, a thin film organic EL element is provided on a substrate on which a TFT (thin-film transistor) is provided. In the organic EL element, an organic EL layer including a light emitting layer is laminated between a pair of electrodes. The TFT is connected to one of the pair of electrodes. When a voltage is applied across the pair of electrodes, the light emitting layer emits light, and thus an image is displayed.

In organic EL display devices such as that described above, there are cases where deterioration of the organic EL element is caused by moisture or oxygen coming from outside. Thus, as disclosed in Patent Document 1 below, for example, in order to prevent deterioration caused by moisture or oxygen, it has conventionally been proposed to fill the inside of an organic EL display device with a desiccant (getter) using a DAM & FILL (dam-and-fill) method. That is to say, this conventional organic EL display device has a configuration in which an opposing substrate opposing the above-described substrate is provided on the organic EL element side, a sealing resin (seal material) with low moisture permeability is formed in a frame-like shape around the organic EL element, and a desiccant is sealed within a space enclosed by the substrate, the opposing substrate, and the sealing resin such that the desiccant covers the organic EL element, and this configuration is considered to be able to prevent deterioration of the organic EL element that is caused by moisture or oxygen coming from outside.

CITATION LIST

Patent Document

Patent Document 1: JP 2005-174557A

DISCLOSURE OF INVENTION

Problem to be Solved by the Invention

However, with respect to conventional organic EL display devices (electroluminescent devices) such as that described above, there are cases where the problem of a decrease in reliability of the organic EL display device arises as a result of the desiccant moving inside that organic EL display device, making the internal distribution of the desiccant nonuniform, and/or making the gap between the substrate and the opposing substrate nonuniform and thereby causing a decrease in strength of the organic EL display device.

More specifically, in conventional organic EL display devices, generally, a screen is used in a vertical state (i.e., a state in which the screen is parallel to the direction of gravity). Moreover, in conventional organic EL display devices, a non-curing material such as a viscous fluid is used as the above-described desiccant. Therefore, in such a conventional organic EL display device, depending on the screen size, the amount of the desiccant that fills the inside of the organic EL display device, or the values of the properties, such as viscosity, of the desiccant, for example, there are cases where the desiccant moves inside the organic EL display device to a lower side due to gravitation. Thus, in this conventional organic EL display device, the distribution of the desiccant within the organic EL display device becomes nonuniform, that is, the amount of the desiccant on an upper side becomes smaller than that on the lower side, and there is a risk that deterioration of the organic EL element due to moisture or oxygen may occur on the upper side. Moreover, in this conventional organic EL display device, since the amount of the desiccant on the lower side becomes larger, there is a risk that the organic EL display device may warp, that is, the gap between the substrate and the opposing substrate may become nonuniform, resulting in a decrease in the strength of the organic EL display device. Consequently, this conventional organic EL display device may have the problem of a decrease in its reliability.

In view of the above-described problem, an object of the present invention is to provide an electroluminescent device that can prevent a decrease in reliability that is caused by movement of a desiccant.

Means for Solving Problem

In order to attain the above-described object, an electroluminescent device according to the present invention is an electroluminescent device having a substrate and an electroluminescent element provided on the substrate, the electroluminescent device including:

an opposing substrate that is provided on the electroluminescent element side and that opposes the substrate;

a desiccant that is provided between the substrate and the opposing substrate such that the desiccant covers the electroluminescent element;

a frame-shaped seal material that seals the electroluminescent element between the substrate and the opposing substrate; and a holding member for holding the desiccant, the holding member being provided on the opposing substrate side inside the seal material.

In the electroluminescent device having the above-described configuration, the holding member for holding the desiccant is provided on the opposing substrate side inside the seal material. Thus, unlike the above-described conventional example, an electroluminescent device that can prevent a decrease in reliability that is caused by movement of a desiccant can be obtained.

In the above-described electroluminescent device, it is preferable that the holding member is provided inside the seal material such that the holding member partitions the inside of the seal material on the opposing substrate and forms a plurality of filling regions each filled with the desiccant.

In this case, filling with the desiccant can be easily performed.

In the above-described electroluminescent device, it is preferable that the plurality of filling regions are provided such that areas of the filling regions on the opposing substrate become smaller along a direction of gravity during use of the electroluminescent device.

In this case, even when the desiccant moves due to gravitation, the adverse effects of this movement can be minimized.

In the above-described electroluminescent device, it is preferable that the holding member is provided with a perpendicular portion that extends in a direction perpendicular to the direction of gravity during use of the electroluminescent device.

In this case, the perpendicular portion enables the desiccant to be easily held during use.

In the above-described electroluminescent device, it is preferable that the holding member is integrated with the opposing substrate.

In this case, an electroluminescent device that is easy to manufacture and that has a small number of components can be easily obtained.

In the above-described electroluminescent device, it is preferable that the holding member is integrated with the seal material.

In this case, an electroluminescent device that is easy to manufacture and that has a small number of components can be easily obtained.

In the above-described electroluminescent device, it is preferable that the desiccant includes a viscous fluid.

In this case, the desiccant can be easily placed in the electroluminescent device.

Effects of the Invention

According to the present invention, it is possible to provide an electroluminescent device that can prevent a decrease in reliability that is caused by movement of a desiccant.

BRIEF DESCRIPTION OF DRAWINGS

FIG. 12 is a cross-sectional view, taken along line XII-XII in FIG. 13, for explaining an organic EL display device according to a fourth embodiment of the present invention.

DESCRIPTION OF THE INVENTION

Figure 1:
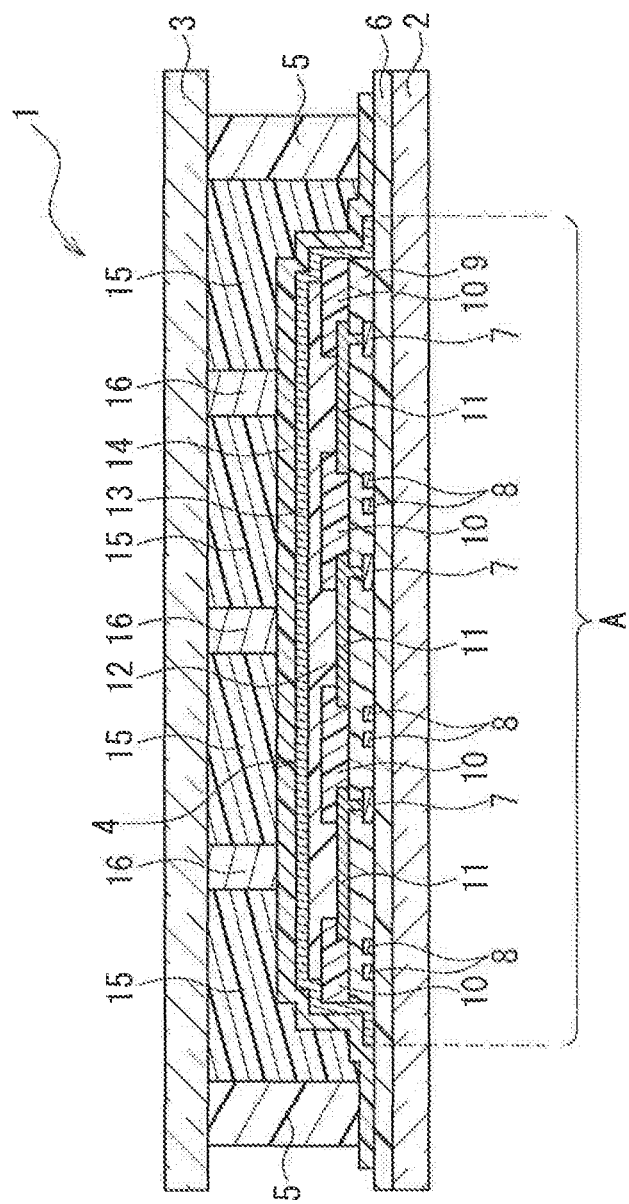
FIG. 1 is a cross-sectional view, taken along line I-I in FIG. 2, for explaining an organic EL display device according to a first embodiment of the present invention.

Hereinafter, preferred embodiments of the electroluminescent device of the present invention will be described with reference to the drawings. It should be noted that in the following description, a case where the present invention is applied to an organic EL display device will be described by way of example. Moreover, it should be understood that the dimensions of various constituent members in the drawings are not faithful representations of the dimensions of actual constituent members, dimensional ratios of those constituent members, and the like.

[First Embodiment]

Figure 2:
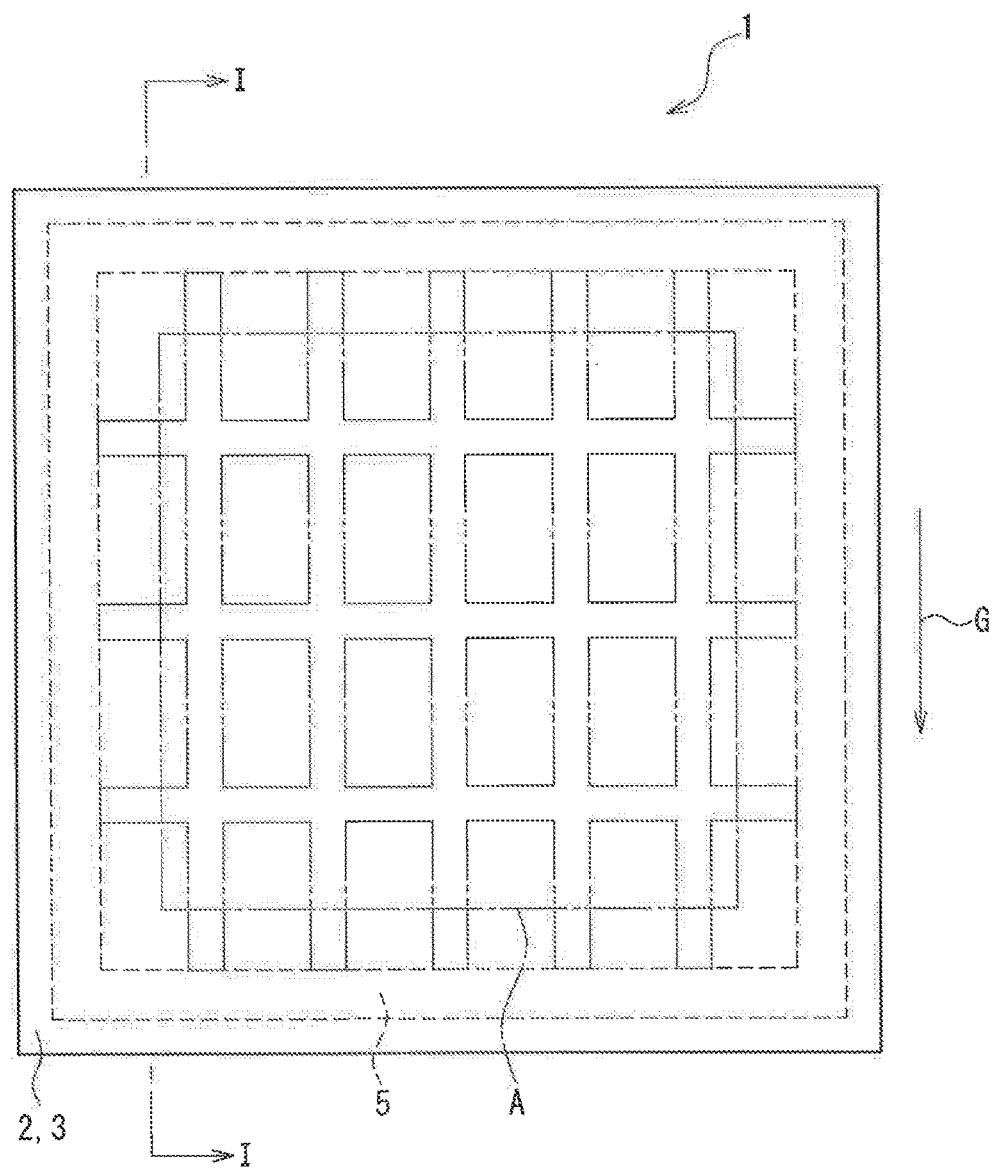
FIG. 2 is a plan view of the organic EL display device.

FIG. 1 is a cross-sectional view, taken along line I-I in FIG. 2, for explaining an organic EL display device according to a first embodiment of the present invention. FIG. 2 is a plan view of the organic EL display device. In FIG. 1, an organic EL display device 1 of the present embodiment is equipped with a TFT substrate 2 serving as a substrate and an organic EL element 4 serving as an electroluminescent (Electro Luminescence) element, the organic EL element 4 being provided on the TFT substrate 2. The organic EL element 4 is sealed by the TFT substrate 2, an opposing substrate 3 that is provided on the organic EL element 4 side such that the opposing substrate 3 opposes the TFT substrate 2, and a sealing resin 5 serving as a seal material, the sealing resin 5 being provided between the TFT substrate 2 and the opposing substrate 3.

That is to say, in the organic EL display device 1 of the present embodiment, referring also to FIG. 2, the organic EL element 4 constitutes a pixel region A having a plurality of pixels, and this organic EL element 4 is disposed inside a space that is enclosed by the TFT substrate 2, the opposing substrate 3, and the frame-shaped sealing resin 5. Also, this pixel region A constitutes a display portion of the organic EL display device 1 and is configured to display information.

Returning to FIG. 1, the TFT substrate 2 and the opposing substrate 3 may be composed of a glass material, for example. A base film (insulation film) 6 is provided on the TFT substrate 2 such that the base film 6 covers the entire surface of the TFT substrate 2, and TFTs (thin-film transistors) 7 for the respective pixels of the pixel region A are provided on this base film 6. Also, lines 8 are formed on the base film 6, the lines 8 including a plurality of source lines (signal lines) and a plurality of gate lines that are arranged in a matrix. The source lines and the gate lines are connected to a source driver and a gate driver (not shown), respectively, and are configured to drive the TFTs 7 for the respective pixels in response to image signals input from the outside. Moreover, the TFTs 7 function as switching elements that control light emission of the corresponding pixels, and are configured to control light emission of the pixels constituted by the organic EL element 4 and individually representing the red (R), green (G), or blue (B) color.

It should be noted that the base film 6 is used to prevent deterioration in the characteristics of the TFTs 7 due to impurity diffusion from the TFT substrate 2 to the TFTs 7, and may be omitted if there is no need for concern about such deterioration.

Moreover, an interlayer insulation film 9, an edge cover 10, and a first electrode 11 of the organic EL element 4 are formed on the TFT substrate 2. The interlayer insulation film 9 functions also as a planarization film and is provided on the base film 6 such that the interlayer insulation film 9 covers the TFTs 7 and the lines 8. The edge cover 10 is formed on the interlayer insulation film 9 such that the edge cover 10 covers pattern end portions of the first electrode 11. The edge cover 10 is configured to function also as an insulation layer for preventing short-circuiting of the first electrode 11 and a second electrode 13, which will be described later. Moreover, the first electrode 11 is connected to the TFTs 7 through contact holes that are formed in the interlayer insulation film 9.

Moreover, openings in the edge cover 10, that is, portions through which the first electrode 11 is exposed substantially constitute light-emitting regions of the organic EL element 4, which emit light in any of the RGB colors as described above, and thus, the organic EL display device 1 of the present embodiment is configured to be capable of displaying in full color.

Moreover, an organic EL layer 12 and the second electrode 13 are formed on the first electrode 11. The organic EL element 4 is constituted by the first electrode 11, the organic EL layer 12, and the second electrode 13. That is to say, the organic EL element 4 may be, for example, a light-emitting element capable of emitting light with high luminance by being driven with a low-voltage direct current, and includes the first electrode 11, the organic EL layer 12, and the second electrode 13.

More specifically, in the case where the first electrode 11 is an anode, a hole injection layer, a hole transport layer, a light-emitting layer, an electron transport layer, an electron injection layer, and the like are laminated (not shown) in that order from the first electrode 11 side and serve as the organic EL layer 12, and the second electrode 13 serving as a cathode is further formed thereon. Besides the above-described configuration, a configuration may also be adopted in which a single layer has two or more types of functionality in such a manner that the hole injection layer doubles as the hole transport layer, for example. Also, a carrier blocking layer and the like may be inserted in the organic EL layer 12 as appropriate.

On the other hand, in the case where the second electrode 13 is an anode, the above-described order of the layers in the organic EL layer 12 is reversed.

Moreover, the organic EL display device 1 of the present embodiment is configured as a bottom emission type. That is to say, in the present embodiment, with the first electrode 11 being constituted by a transparent electrode or a semi-transparent electrode and the second electrode 13 being constituted by a reflective electrode, the organic EL display device 1 of the present embodiment is configured as the bottom emission type that emits light from the TFT substrate 2 side. In other words, in the organic EL display device 1 of the present embodiment, a holding member, which will be described later, is disposed on the opposing substrate 3 side of the organic EL element 4, and thus, if the organic EL display device 1 is configured as a top emission type that emits light from the opposing substrate 3 side, there is a risk that the display quality may be reduced.

Moreover, in the organic EL display device 1 of the present embodiment, in order to prevent damage to the organic EL element 4 during filling with a desiccant 15, which will be described later, or due to a foreign matter, and in order to prevent the organic EL element 4 from being damaged by moisture or oxygen intruding from the outside before filling with the desiccant 15, a protective film 14 is formed on the organic EL element 4. It should be noted that besides the above-described configuration, a configuration may also be adopted in which the protective film 14 is omitted.

Moreover, in the organic EL display device 1 of the present embodiment, as described above, the organic EL element 4 is sealed by the TFT substrate 2, the opposing substrate 3, and the sealing resin 5. Moreover, the sealing resin 5 is composed of a resin, such as an acrylic resin, a polyimide resin, an epoxy resin, or a phenolic resin, for example, in which a spacer that defines a cell gap between the TFT substrate 2 and the opposing substrate 3 as well as inorganic particles are dispersed, and as shown in FIG. 2, the sealing resin 5 is formed in a frame-like shape around the perimeter of the pixel region A. Moreover, moisture permeability of the sealing resin 5 can be reduced even more by inorganic particles being dispersed in the sealing resin 5.

Moreover, in the organic EL display device 1 of the present embodiment, the desiccant 15 is provided on the organic EL element 4 via the protective film 14 so as to cover the organic EL element 4 and sealed between the TFT substrate 2 and the opposing substrate 3. Moreover, in the organic EL display device 1 of the present embodiment, a holding member 16 for holding the desiccant 15 is provided, the holding member 16 being disposed on the opposing substrate 3 side inside the sealing resin 5 as will be described in detail later.

The desiccant 15 includes a fluid having viscosity (e.g., 0.5 to 10 pa·c). More specifically, for example, a desiccant produced by dispersing a metallic oxide, such as aluminum hydroxide or calcium oxide, or activated carbon in a resin is used as the desiccant 15. In this manner, the organic EL display device 1 of the present embodiment employs a viscous fluid as the desiccant 15, and thus the desiccant 15 can be easily placed in the organic EL display device 1.

The desiccant 15 fills the inside of a filling region, which will be described later and which is defined on the opposing substrate 3 by the sealing resin 5 and the holding member 16. The desiccant 15 is disposed within a space enclosed by the protective film 14 (organic EL element 4) and the filling region and is configured to trap and absorb moisture and oxygen that have passed through the sealing resin 5.

Figure 3:
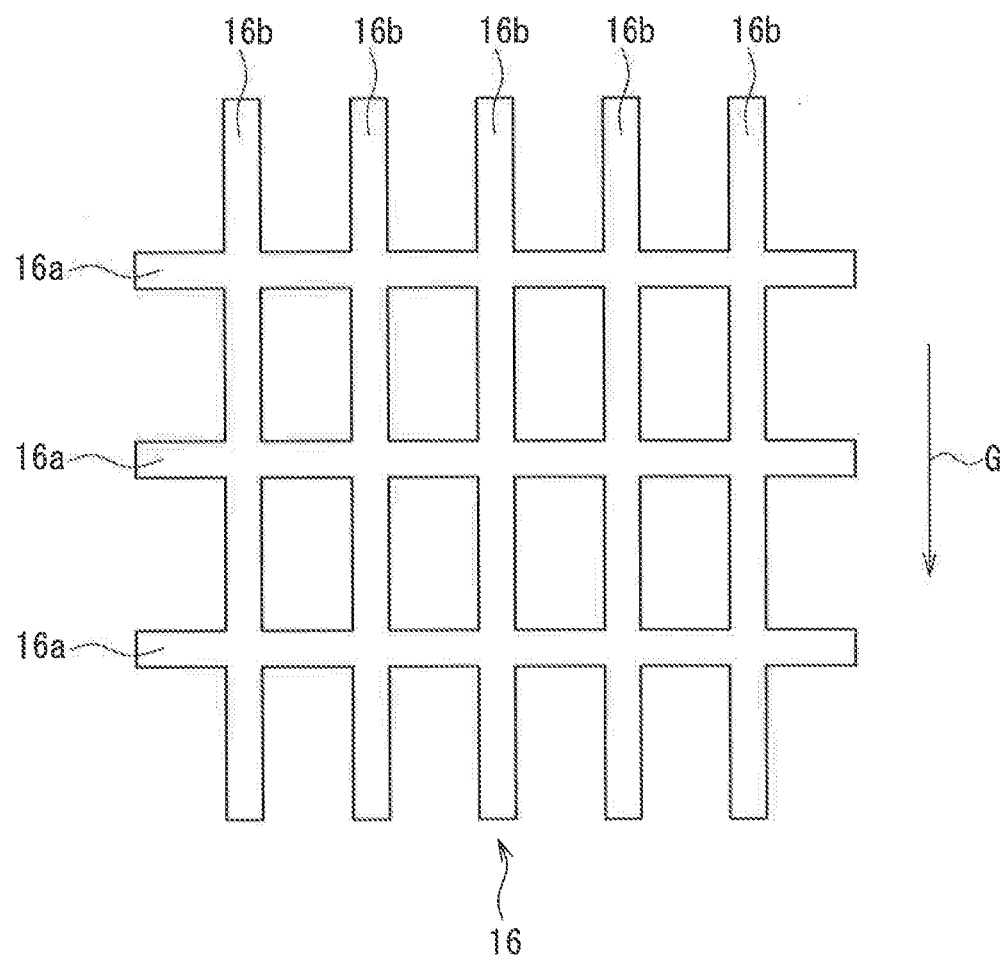
FIG. 3 is a plan view of a holding member shown in FIG. 1.
Figure 4:
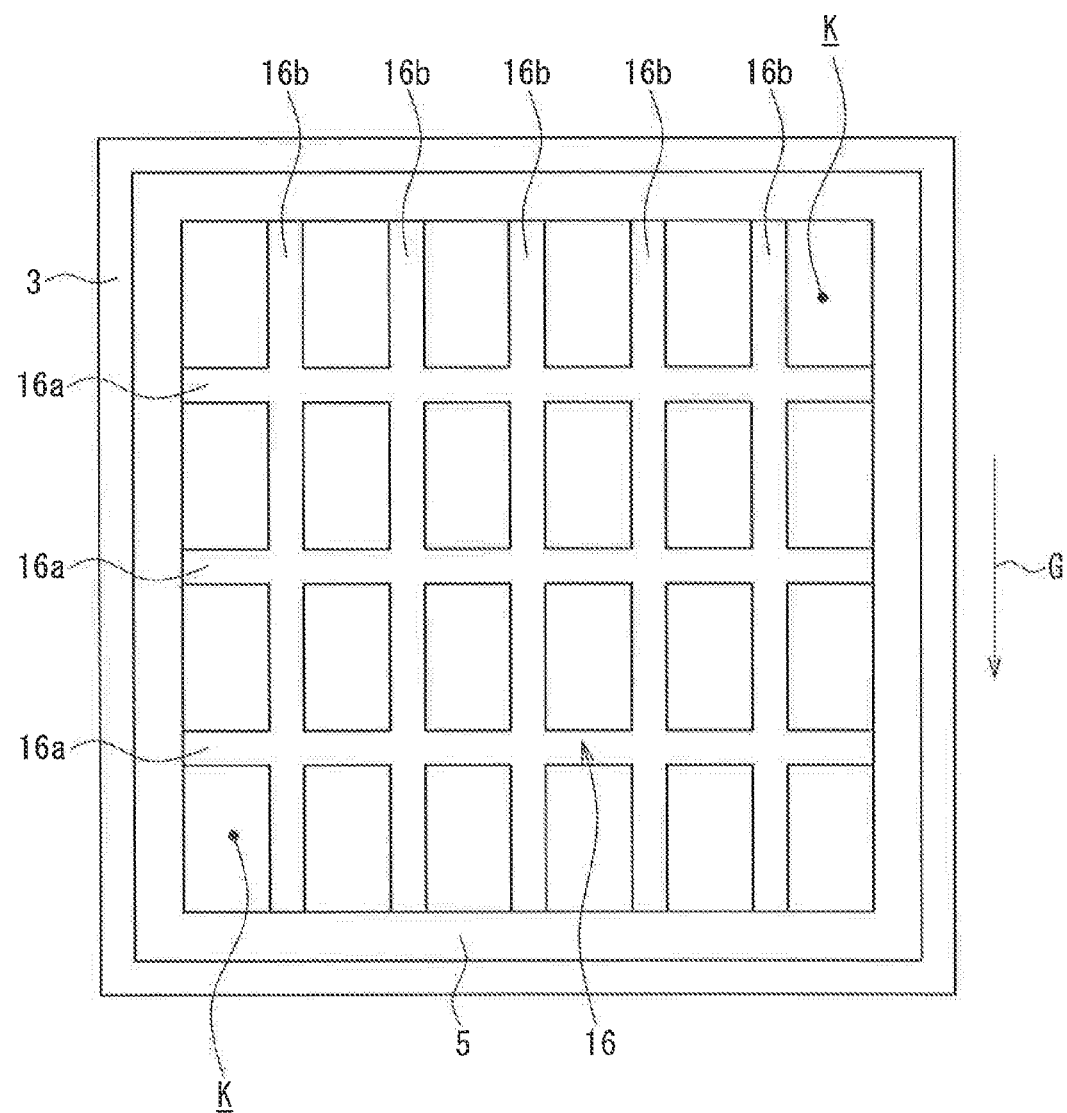
FIG. 4 is a plan view showing an opposing substrate, a sealing resin, and the holding member when viewed from an organic EL element side shown in FIG. 1.

Here, referring to FIGS. 3 and 4, the configuration of principal portions of the organic EL display device 1 of the present embodiment will be specifically described.

FIG. 3 is a plan view of the holding member shown in FIG. 1. FIG. 4 is a plan view showing the opposing substrate, the sealing resin, and the holding member when viewed from the organic EL element side shown in FIG. 1.

First, the holding member 16 of the present embodiment will be specifically described using FIG. 3.

As shown in FIG. 3, the holding member 16 is formed in a lattice-like shape. That is to say, the holding member 16 includes a plurality of for example, three perpendicular portions 16a that extend in a direction perpendicular to the direction G of gravity during use of the organic EL display device 1 and a plurality of for example, five horizontal portions 16b that extend orthogonally to these perpendicular portions 16a.

The holding member 16 may be composed of metal, resin, or a glass material, for example. It should be noted that in the case where a transparent material such as a glass material is used as the material which the holding member 16 is composed of the organic EL display device 1 of the present embodiment can be configured as the top emission type.

Moreover, as shown in FIG. 4, the holding member 16 is provided inside the sealing resin 5 such that the holding member 16 partitions the inside of the sealing resin 5 on the opposing substrate 3 and forms a plurality of filling regions K that are to be each filled with the desiccant 15 (FIG. 1).

More specifically, in the organic EL display device 1 of the present embodiment, the sealing resin 5 is applied to the surface of the opposing substrate 3 using a nozzle dispenser, for example, in such a manner as to form a frame-like shape surrounding the pixel region A (FIG. 2). Then, as shown in FIG. 4, the holding member 16 is fixed to the surface of the opposing substrate 3 inside the frame-shaped sealing resin 5. Thus, in the organic EL display device 1 of the present embodiment, twenty-four filling regions K are formed as shown in FIG. 4 by way of example. Moreover, in the organic EL display device 1 of the present embodiment, these filling regions K are configured such that the filling regions K have equal areas on the opposing substrate 3.

Moreover, in order to prevent the protective film 14 from being damaged when the TFT substrate 2 and the opposing substrate 3 are attached to each other, the dimension of the holding member 16 in a direction that is perpendicular to the surface of the opposing substrate 3 is determined such that a gap is created between the holding member 16 and the protective film 14. That is to say, in FIG. 1, the protective film 14 and the holding member 16 oppose each other via this gap, and thus, damage to the protective film 14 due to contact with the holding member 16 can be prevented (this also holds true for FIG. 5, which will be described later).

It should be noted that besides the above-described configuration, a configuration may also be adopted in which a spacer is provided between the protective film 14 and the holding member 16 (this also holds true for second to fourth embodiments, which will be described later).

Furthermore, in the organic EL display device 1 of the present embodiment, the inside of the filling regions K is filled with the desiccant 15 using a liquid crystal dropping method (ODF method), for example. Thus, in the organic EL display device 1 of the present embodiment, the desiccant 15 is sealed within spaces enclosed by the protective film 14 (organic EL element 4) and the filling regions K, and movement of the desiccant 15 into the adjacent filling regions K is substantially prevented by the holding member 16.

In the organic EL display device 1 of the present embodiment that is configured as described above, the holding member 16 for holding the desiccant 15 is provided on the opposing substrate 3 side inside the sealing resin (seal material) 5. Thus, according to the present embodiment, unlike the above-described conventional examples, an organic EL display device (electroluminescent device) 1 that can prevent a decrease in reliability that is caused by movement of the desiccant 15 can be obtained.

Moreover, in the present embodiment, the holding member 16 is provided inside the sealing resin 5 such that the holding member 16 partitions the inside of the sealing resin 5 on the opposing substrate 3 and forms the plurality of filling regions K that are to be each filled with the desiccant 15. Thus, according to the present embodiment, filling with the desiccant 15 can be easily performed.

[Second Embodiment]

Figure 5:
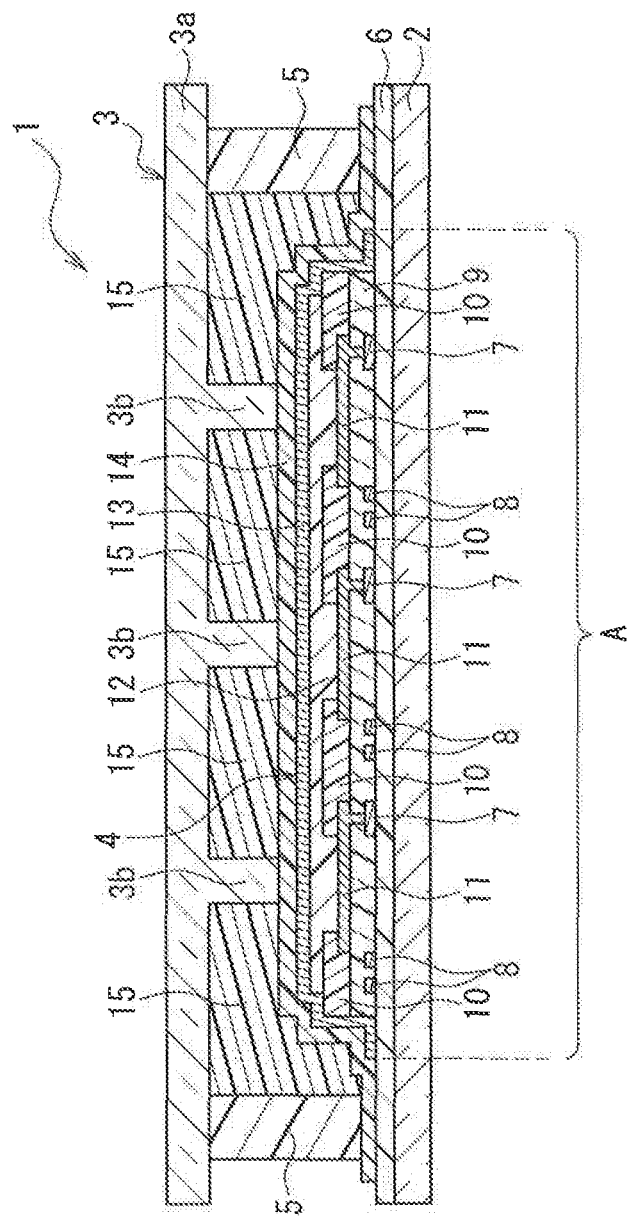
FIG. 5 is a cross-sectional view, taken along line V-V in FIG. 6, for explaining an organic EL display device according to a second embodiment of the present invention.
Figure 6:
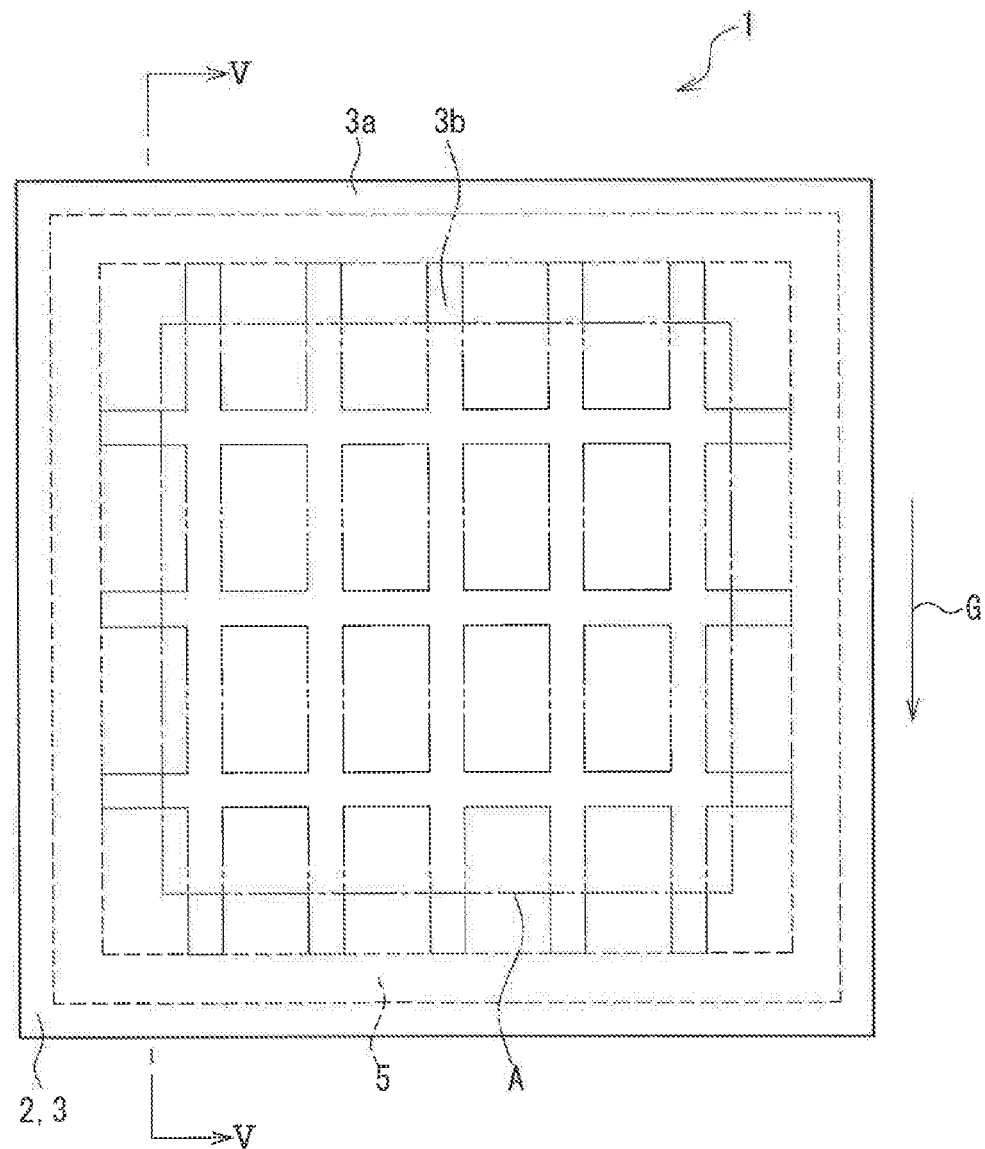
FIG. 6 is a plan view of the organic EL display device shown in FIG. 5.
Figure 7:
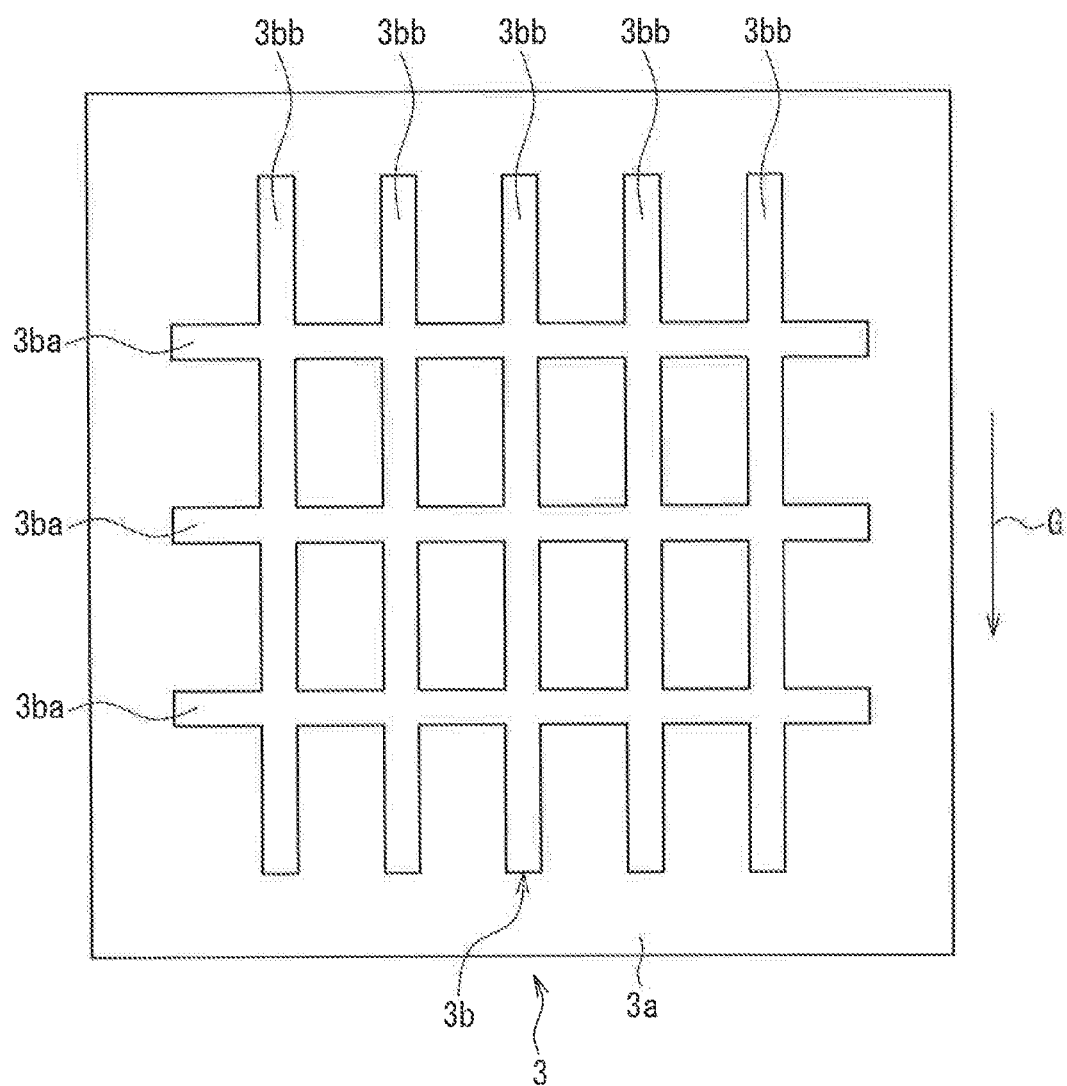
FIG. 7 is a plan view of an opposing substrate and a holding member shown in FIG. 5.
Figure 8:
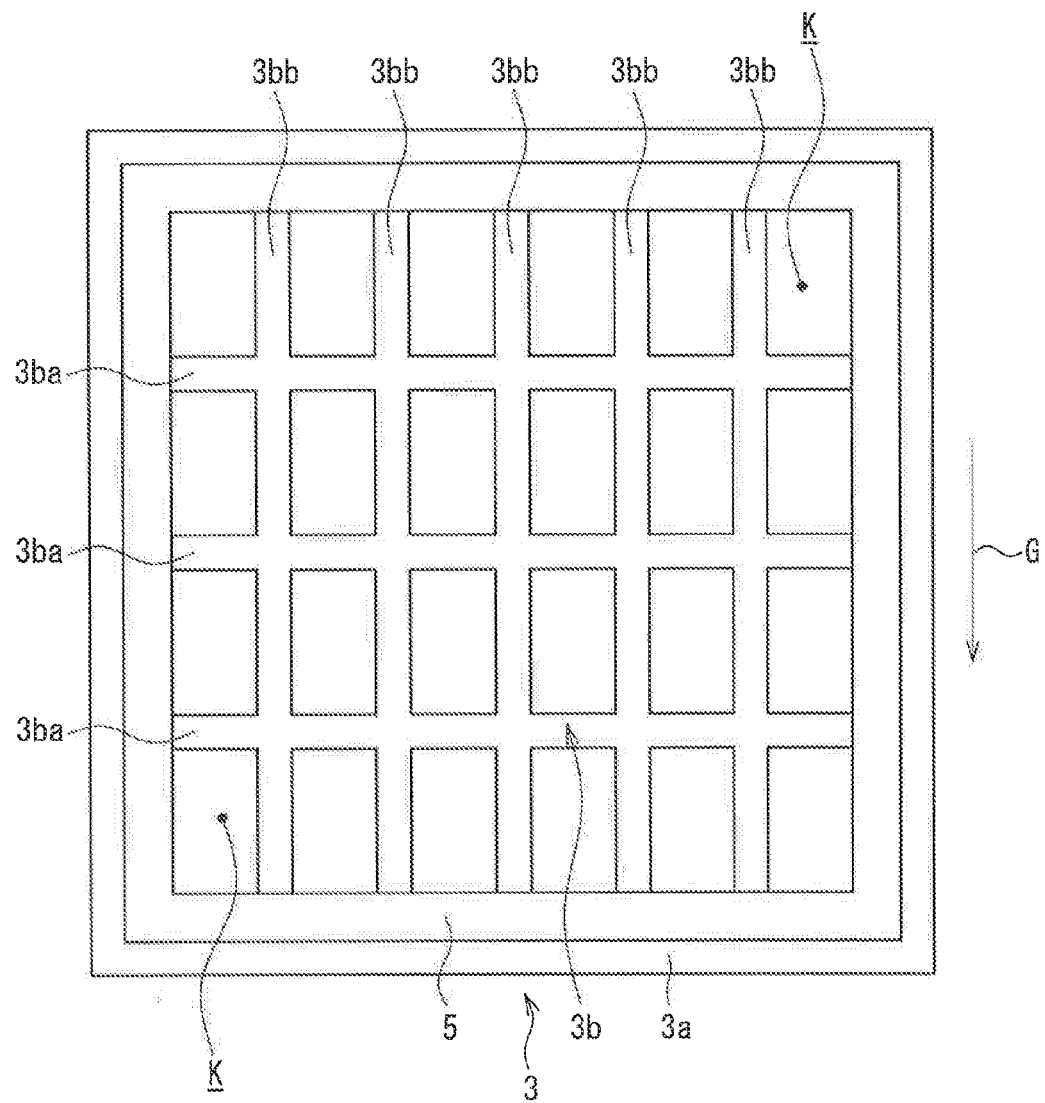
FIG. 8 is a plan view showing the opposing substrate, a sealing resin, and the holding member when viewed from an organic EL element side shown in FIG. 5.

FIG. 5 is a cross-sectional view, taken along line V-V in FIG. 6, for explaining an organic EL display device according to a second embodiment of the present invention. FIG. 6 is a plan view of the organic EL display device shown in FIG. 5. FIG. 7 is a plan view of an opposing substrate and a holding member shown in FIG. 5. FIG. 8 is a plan view showing the opposing substrate, a sealing resin, and the holding member when viewed from an organic EL element side shown in FIG. 5.

In the drawings, the present embodiment mainly differs from the first embodiment above in that the opposing substrate and the holding member are integrated into one piece. It should be noted that elements that are the same as those of the first embodiment above are denoted by the same reference numerals, and a redundant description of those elements is omitted.

That is to say, as shown in FIGS. 5 and 6, in the organic EL display device 1 of the present embodiment, the opposing substrate 3 has an opposing substrate main body 3a and a holding member 3b. In other words, in the organic EL display device 1 of the present embodiment, the holding member 3b is integrated with the opposing substrate 3.

More specifically, as shown in FIG. 7 by way of example, on that surface of the opposing substrate 3 that is located on the TFT substrate 2 side, the holding member 3b is formed on the opposing substrate main body 3a, the holding member 3b having three perpendicular portions 3ba that extend in the direction perpendicular to the direction G of gravity during use of the organic EL display device 1 and five horizontal portions 3bb that extend orthogonally to these perpendicular portions 3ba.

Moreover, the organic EL display device 1 of the present embodiment can be configured as not only the bottom emission type, but also as the top emission type by using a transparent glass material as the material which the opposing substrate 3 is composed of. That is to say, in the organic EL display device 1 of the present embodiment, it is also possible that the first electrode 11 is constituted by a reflective electrode, the second electrode 13 is constituted by a transparent electrode or a semi-transparent electrode, and light is emitted from the opposing substrate 3.

Moreover, as shown in FIG. 8, in the organic EL display device 1 of the present embodiment, the sealing resin 5 is formed on the opposing substrate 3 so that the holding member 3b is disposed inside the frame-shaped sealing resin 5. Thus, in the organic EL display device 1 of the present embodiment, similar to the filling regions of the first embodiment, twenty-four filling regions K are formed as shown in FIG. 8 by way of example.

Moreover, in the organic EL display device 1 of the present embodiment, similar to the holding member of the first embodiment, in order to prevent the protective film 14 from being damaged when the TFT substrate 2 and the opposing substrate 3 are attached to each other, the dimension of the holding member 3b in the direction that is perpendicular to the surface of the opposing substrate main body 3a is determined such that a gap is created between the holding member 3b and the protective film 14.

Configured as described above, the present embodiment can have effects similar to those of the first embodiment above. Moreover, according to the present embodiment, since the holding member 3b is integrated with the opposing substrate 3, an organic EL display device 1 that is easy to manufacture and that has a small number of components can be easily obtained.

[Third Embodiment]

Figure 9:
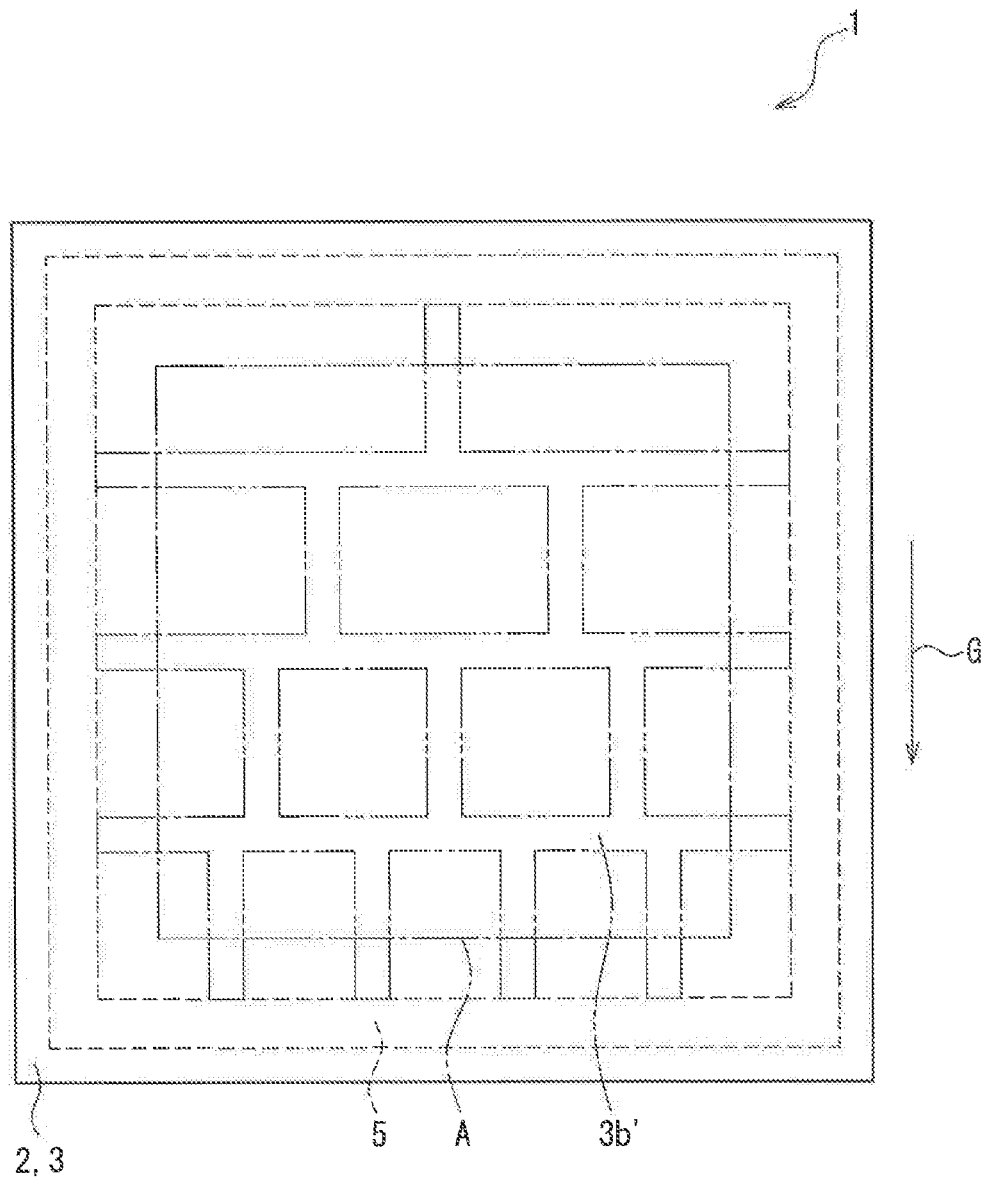
FIG. 9 is a plan view of an organic EL display device according to a third embodiment of the present invention.
Figure 10:
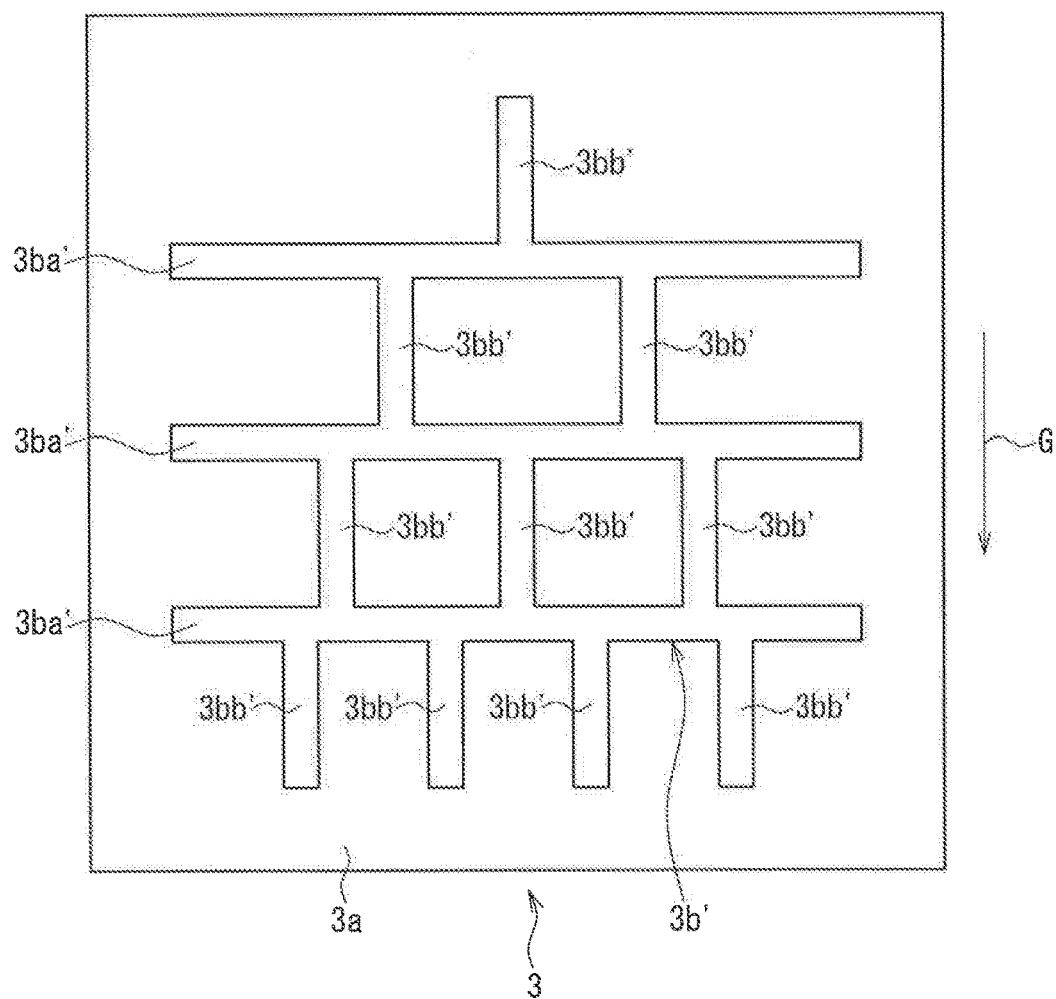
FIG. 10 is a plan view of an opposing substrate and a holding member shown in FIG. 9.
Figure 11:
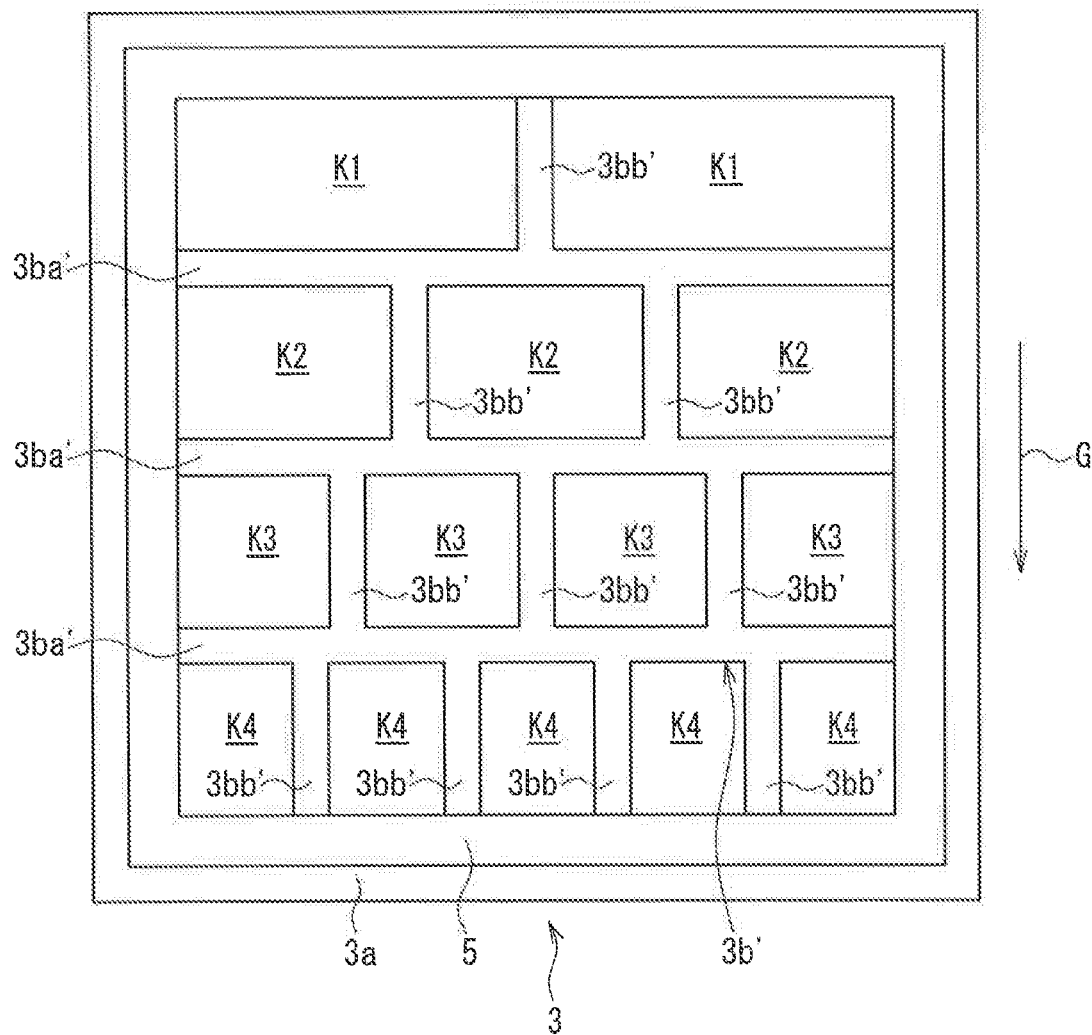
FIG. 11 is a plan view showing the opposing substrate, a sealing resin, and the holding member when viewed from an organic EL element side of the organic EL display device shown in FIG. 9.

FIG. 9 is a plan view of an organic EL display device according to a third embodiment of the present invention. FIG. 10 is a plan view of an opposing substrate and a holding member shown in FIG. 9. FIG. 11 is a plan view showing the opposing substrate, a sealing resin, and the holding member when viewed from an organic EL element side of the organic EL display device shown in FIG. 9.

In the drawings, the present embodiment mainly differs from the second embodiment above in that the plurality of filling regions are provided such that the areas of the filling regions on the opposing substrate become smaller along the direction of gravity during use of the organic EL display device. It should be noted that elements that are the same as those of the second embodiment above are denoted by the same reference numerals, and a redundant description of those elements is omitted.

That is to say, as shown in FIG. 9, in the organic EL display device 1 of the present embodiment, unlike the holding member of the second embodiment, a holding member 3b' is configured to have a non-uniform lattice-like shape.

More specifically, as shown in FIG. 10 by way of example, on the surface of the opposing substrate 3 that is located on the TFT substrate 2 side, three perpendicular portions 3ba' that extend in the direction perpendicular to the direction G of gravity during use of the organic EL display device 1 are formed on the opposing substrate main body 3a.

Moreover, in the opposing substrate 3, a single horizontal portion 3bb' is formed on the opposing substrate main body 3a such that the horizontal portion 3bb' is at a position that bisects the first perpendicular portion 3ba' from the top in FIG. 10 and the horizontal portion 3bb' extends orthogonally to this perpendicular portion 3ba'. Moreover, two horizontal portions 3bb' are formed on the opposing substrate main body 3a such that the horizontal portions 3bb' are at respective positions that trisect the first and the second perpendicular portion 3ba' from the top in FIG. 10 and the horizontal portions 3bb' extend orthogonally to these perpendicular portions 3ba'.

Moreover, three horizontal portions 3bb' are formed on the opposing substrate main body 3a such that the horizontal portions 3bb' are at respective positions that divide the second and the third perpendicular portion 3ba' from the top in FIG. 10 into four equal parts and the horizontal portions 3bb' extend orthogonally to these perpendicular portions 3ba'. Moreover, four horizontal portions 3bb' are formed on the opposing substrate main body 3a such that the horizontal portions 3bb' are at respective positions that divide the third perpendicular portion 3ba' from the top in FIG. 10 into five equal parts and the horizontal portions 3bb' extend orthogonally to this perpendicular portion 3ba'.

Moreover, similar to the organic EL display device of the second embodiment, the organic EL display device 1 of the present embodiment can be configured as not only the bottom emission type, but also as the top emission type.

Moreover, as shown in FIG. 11, in the organic EL display device 1 of the present embodiment, the sealing resin 5 is formed on the opposing substrate 3 such that the holding member 3b' is disposed inside the frame-shaped sealing resin 5. Thus, in the organic EL display device 1 of the present embodiment, unlike the filling regions of the second embodiment, a plurality of filling regions K1, K2, K3, and K4 are provided in such a manner that the areas of the filling regions K1 to K4 on the opposing substrate 3 become smaller along the direction G of gravity during use of the organic EL display device 1 as shown in FIG. 11 by way of example.

More specifically, in the organic EL display device 1 of the present embodiment, the filling regions K1 at the top in FIG. 11 each have the largest area on the opposing substrate 3, and the areas of the filling regions K2, K3, and K4 on the opposing substrate 3 become smaller in that order.

Moreover, in the organic EL display device 1 of the present embodiment, similar to the holding member of the second embodiment, in order to prevent the protective film 14 from being damaged when the TFT substrate 2 and the opposing substrate 3 are attached to each other, the dimension of the holding member 3b' in the direction that is perpendicular to the surface of the opposing substrate main body 3a is determined such that a gap is created between the holding member 3b' and the protective film 14.

Configured as described above, the present embodiment can have effects similar to those of the second embodiment above. Moreover, according to the present embodiment, the plurality of filling regions K1, K2, K3, and K4 are provided such that the areas of the filling regions K1 to K4 on the opposing substrate 3 become smaller along the direction G of gravity during use of the organic EL display device 1. Thus, according to the present embodiment, even when the desiccant 15 moves due to gravitation, the adverse effects of this movement can be minimized. That is to say, since the above-described area of the filling regions K1 that are located on the top side (i.e., opposite side to the direction G of gravity) during use of the organic EL display device 1 is set to be the largest, even if the desiccant 15 sealed in the inside of these filling regions K1 slightly moves toward the filling regions K2, the balance of distribution of the desiccant 15 can be restrained from becoming uneven because the amount of the desiccant 15 sealed in each filling region K1 is larger than those in the other filling regions K2 to K4.

[Fourth Embodiment]

Figure 13:
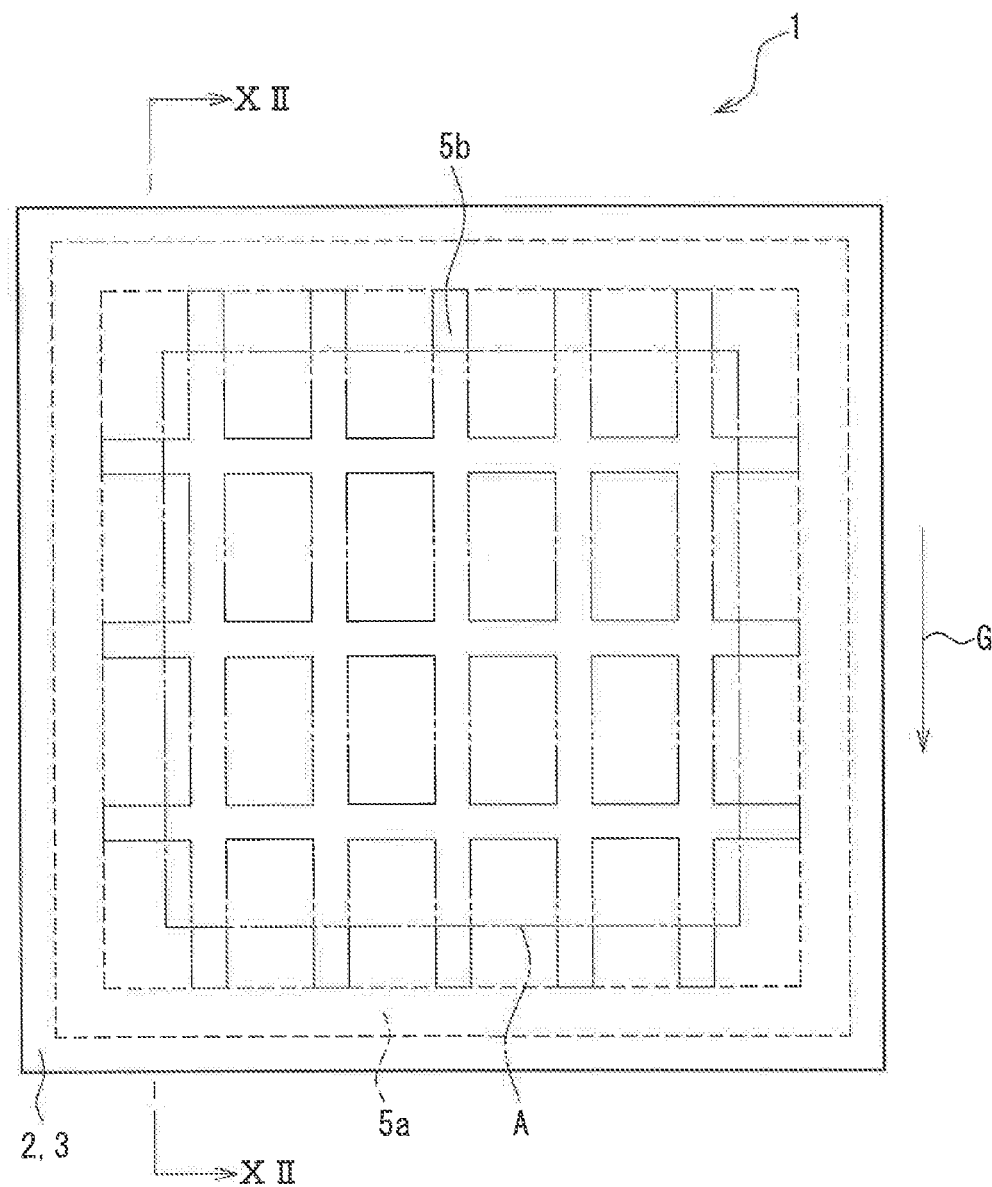
FIG. 13 is a plan view of the organic EL display device shown in FIG. 12.
Figure 14:
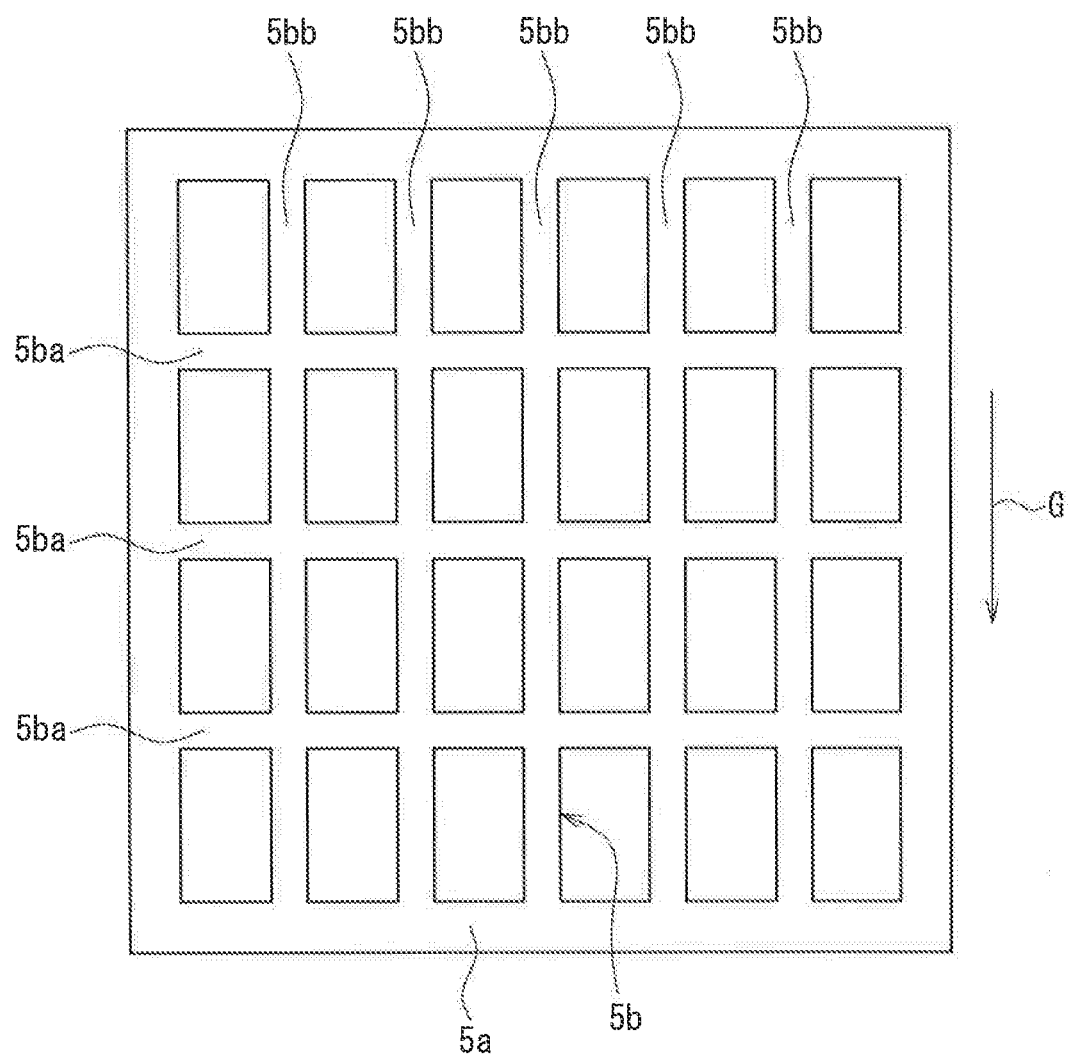
FIG. 14 is a plan view of a sealing resin and a holding member shown in FIG. 12.
Figure 15:
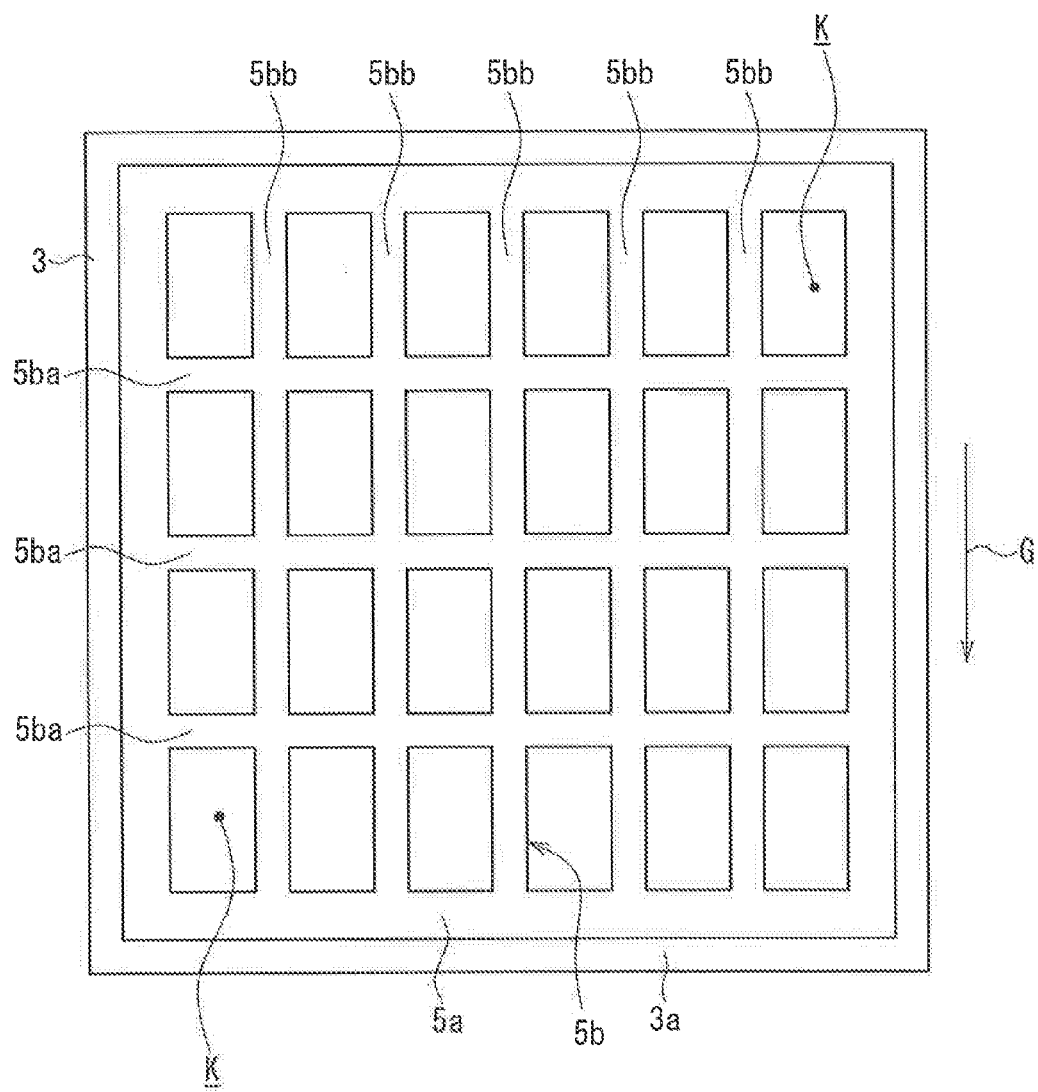
FIG. 15 is a plan view showing an opposing substrate, the sealing resin, and the holding member when viewed from an organic EL element side shown in FIG. 12.

FIG. 12 is a cross-sectional view, taken along line XII-XII in FIG. 13, of an organic EL display device according to a fourth embodiment of the present invention. FIG. 13 is a plan view of the organic EL display device shown in FIG. 12. FIG. 14 is a plan view of a sealing resin and a holding member shown in FIG. 12. FIG. 15 is a plan view showing an opposing substrate, the sealing resin, and the holding member when viewed from the side of an organic EL element shown in FIG. 12.

In the drawings, the present embodiment mainly differs from the first embodiment above in that the sealing resin (seal material) and the holding member are integrated into one piece. It should be noted that elements that are the same as those of the first embodiment above are denoted by the same reference numerals, and a redundant description of those elements is omitted.

That is to say, as shown in FIGS. 12 and 13, in the organic EL display device 1 of the present embodiment, a holding member 5b and a sealing resin main body 5a serving as the seal material are configured as one piece. In other words, in the organic EL display device 1 of the present embodiment, the holding member 5b is integrated with the sealing resin.

More specifically, as shown in FIG. 14 by way of example, the sealing resin is provided with the sealing resin main body 5a that is configured to have a frame-like shape and the holding member 5b that is provided on the inside of this sealing resin main body 5a and that has a lattice-like shape. Moreover, the holding member 5b includes three perpendicular portions 5ba that extend in the direction perpendicular to the direction G of gravity during use of the organic EL display device 1 and five horizontal portions 5bb that extend orthogonally to these perpendicular portions 5ba.

Moreover, since the holding member 5b of the organic EL display device 1 of the present embodiment is constituted by the sealing resin, it is preferable to configure the organic EL display device 1 as the bottom emission type, which does not cause a decrease in the display quality.

Moreover, as shown in FIG. 15, in the organic EL display device 1 of the present embodiment, the holding member 5b is formed on the opposing substrate 3 in a state in which the holding member 5b is disposed inside the frame-shaped sealing resin main body 5a. Thus, in the organic EL display device 1 of the present embodiment, similar to the filling regions of the first embodiment, twenty-four filling regions K are formed as shown in FIG. 15 by way of example.

Moreover, in the organic EL display device 1 of the present embodiment, unlike the holding member of the first embodiment, even when the holding member 5b comes into contact with the protective film 14, there is no risk that the protective film 14 may be damaged. Thus, the dimension of the holding member 5b in the direction that is perpendicular to the surface of the opposing substrate 3 is determined such that a leading end surface of the holding member 5b comes into contact with the protective film 14 when the TFT substrate 2 and the opposing substrate 3 are attached to each other.

Configured as described above, the present embodiment can have effects similar to those of the first embodiment above. Moreover, according to the present embodiment, since the holding member 5b is integrated with the sealing resin, an organic EL display device 1 that is easy to manufacture and that has a small number of components can be easily obtained.

It should be noted that the foregoing embodiments are to be considered in all respects as illustrative and not restrictive. The technical scope of the invention is indicated by the appended claims, and all changes which come within the range of equivalency of the configurations specified in the claims are therefore intended to be embraced therein.

For example, although the case where an organic EL element is used as the electroluminescent element has been described in the foregoing description, the present invention is not limited to this, and, for example, an inorganic EL element containing an inorganic compound may also be used.

Moreover, although the case where the present invention is applied to an organic EL display device has been described in the foregoing description, the present invention is not limited to this, and, for example, the present invention is also applicable to an illumination device such as a backlight device.

Moreover, in the foregoing description, the case where the holding member is provided with a perpendicular portion that extends in the direction perpendicular to the direction of gravity during use of the organic EL display device (electroluminescent device) and a horizontal portion that extends orthogonally to this perpendicular portion has been described. However, it is only required that the holding member of the present invention is provided on the opposing substrate side inside the sealing resin (seal material) and used to hold the desiccant, and the shape, configuration, and the like of the holding member is not limited to those described above.

However, a case where a holding member having the above-described perpendicular portion is used as described in the foregoing embodiments is preferred because the perpendicular portion enables the desiccant to be easily held during use.

Moreover, although the case where the TFT substrate (substrate) and the opposing substrate are composed of a glass material, for example, has been described in the foregoing description, the present invention is not limited to this, and, for example, a flexible material such as plastic may also be used as the material which the substrate and the opposing substrate are composed of. In this case, a display device or the like whose display surface is formed in a curved surface shape can be easily obtained.

Moreover, in addition to the foregoing description, the above-described first to fourth embodiments may be combined as appropriate.

INDUSTRIAL APPLICABILITY

The present invention is useful for an electroluminescent device that can prevent a decrease in reliability that is caused by movement of a desiccant.

LIST OF REFERENCE NUMERALS

1 Organic EL display device
2 TFT substrate (substrate)
3 Opposing substrate
3b, 3b' Holding member
3ba, 3ba' Perpendicular portion
4 Organic EL element (electroluminescent element)
5 Sealing resin (seal material)
5a Sealing resin main body (seal material)
5b Holding member
5ba Perpendicular portion
15 Desiccant
16 Holding member
16a Perpendicular portion
K, K1 to K4 Filling region
G Direction of gravity

The invention claimed is:

1. An electroluminescent device having a substrate and an electroluminescent element provided on the substrate, the electroluminescent device comprising:
   an opposing substrate that is provided on the electroluminescent element side and that opposes the substrate;
   a desiccant that is provided between the substrate and the opposing substrate such that the desiccant covers the electroluminescent element;
   a frame-shaped seal material that seals the electroluminescent element between the substrate and the opposing substrate; and
   a holding member for holding the desiccant, the holding member being provided on the opposing substrate side inside the seal material; wherein
   the holding member is provided inside the seal material such that the holding member partitions the inside of the seal material on the opposing substrate and forms a plurality of filling regions each filled with the desiccant; and
   the plurality of filling regions are provided such that areas of the filling regions on the opposing substrate become smaller along a direction of gravity during use of the electroluminescent device.

2. The electroluminescent device according to claim 1, wherein the holding member is provided with a perpendicular portion that extends in a direction perpendicular to the direction of gravity during use of the electroluminescent device.

3. The electroluminescent device according to claim 1, wherein the holding member is integrated with the opposing substrate.

4. The electroluminescent device according to claim 1, wherein the holding member is integrated with the seal material.

5. The electroluminescent device according to claim 1, wherein the desiccant includes a viscous fluid.

6. The electroluminescent device according to claim 1, wherein the holding member has a non-uniform lattice shape.

7. The electroluminescent device according to claim 1, wherein
   the holding member is provided with a plurality of horizontal portions that extend in a direction parallel to the direction of gravity during use of the electroluminescent device, and
   the plurality of horizontal portions are arranged such that a number of the horizontal portions increase along the direction of gravity during use of the electroluminescent device.

\* \* \* \* \*